(12) United States Patent
Pratt (10) Patent No.: US 7,952,170 B2
(45) Date of Patent: May 31, 2011

(54) SYSTEM INCLUDING SEMICONDUCTOR COMPONENTS HAVING THROUGH INTERCONNECTS AND BACK SIDE REDISTRIBUTION CONDUCTORS

(75) Inventor: David S. Pratt, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/837,551

(22) Filed: Jul. 16, 2010

(65) Prior Publication Data

US 2010/0284139 A1    Nov. 11, 2010

Related U.S. Application Data

(62) Division of application No. 12/388,697, filed on Feb. 19, 2009, now Pat. No. 7,781,868, which is a division of application No. 11/635,902, filed on Dec. 8, 2006, now Pat. No. 7,531,443.

(51) Int. Cl.
*H01L 29/40* (2006.01)

(52) U.S. Cl. ........ 257/621; 257/686; 257/690; 438/117; 438/618

(58) Field of Classification Search .................. 257/621, 257/686, 690, 692; 438/117, 618, 660
See application file for complete search history.

(56) References Cited

U.S. PATENT DOCUMENTS

| | | |
|---|---|---|
| 4,530,074 A | 7/1985 | Folmsbee |
| 5,434,451 A | 7/1995 | Dalal et al. |
| 5,503,285 A | 4/1996 | Warren |
| 5,840,199 A | 11/1998 | Warren |
| 5,851,911 A | 12/1998 | Farnworth |
| 5,950,070 A | 9/1999 | Razon et al. |
| 6,294,837 B1 | 9/2001 | Akram et al. |
| 6,380,555 B1 | 4/2002 | Hembree et al. |
| 6,400,172 B1 | 6/2002 | Akram et al. |
| 6,437,254 B1 | 8/2002 | Crudo |
| 6,465,877 B1 | 10/2002 | Farnworth et al. |
| 6,501,165 B1 | 12/2002 | Farnworth et al. |
| 6,582,992 B2 | 6/2003 | Poo et al. |
| 6,611,052 B2 | 8/2003 | Poo et al. |
| 6,620,633 B2 | 9/2003 | Hembree et al. |
| 6,620,731 B1 | 9/2003 | Farnworth et al. |
| 6,638,792 B2 | 10/2003 | Hui et al. |
| 6,569,762 B2 | 5/2004 | Kong |
| 6,740,960 B1 | 5/2004 | Farnworth |
| 6,803,303 B1 | 10/2004 | Hiatt et al. |
| 6,828,175 B2 | 12/2004 | Wood et al. |
| 6,833,613 B1 | 12/2004 | Akram et al. |
| 6,841,883 B1 | 1/2005 | Farnworth et al. |

(Continued)

OTHER PUBLICATIONS

Office Action from U.S. Appl. No. 12/388,697, dated Feb. 22, 2010, pp. 1-17.

(Continued)

*Primary Examiner* — Phuc T Dang
(74) *Attorney, Agent, or Firm* — Stephen A. Gratton (57) ABSTRACT

A system includes a supporting substrate and at least one semiconductor substrate. The semiconductor component includes a semiconductor substrate having a circuit side with integrated circuits and substrate contacts and a back side, a plurality of through interconnects in the substrate, and redistribution conductors on the back side of the substrate. Each through interconnect includes a via aligned with a substrate contact, and a conductive layer at least partially lining the via in physical and electrical contact with the substrate contact. Each redistribution conductor is formed by a portion of the conductive layer.

11 Claims, 5 Drawing Sheets

U.S. PATENT DOCUMENTS

| | | | |
|---|---|---|---|
| 6,897,089 B1 | 5/2005 | Farnworth | |
| 6,903,442 B2 | 6/2005 | Wood et al. | |
| 6,903,443 B2 * | 6/2005 | Farnworth et al. | 257/621 |
| 6,906,418 B2 | 6/2005 | Hiatt et al. | |
| 6,908,784 B1 | 6/2005 | Farnworth et al. | |
| 6,911,355 B2 | 6/2005 | Farnworth et al. | |
| 6,917,090 B2 | 7/2005 | Moden | |
| 6,954,000 B2 | 10/2005 | Hembree et al. | |
| 6,964,915 B2 | 11/2005 | Farnworth et al. | |
| 6,975,037 B2 | 12/2005 | Farnworth et al. | |
| 6,998,717 B2 | 2/2006 | Farnworth et al. | |
| 7,029,949 B2 | 4/2006 | Farnworth et al. | |
| 7,042,080 B2 * | 5/2006 | Kirby et al. | 257/692 |
| 7,060,526 B2 | 6/2006 | Farnworth et al. | |
| 7,078,266 B2 | 7/2006 | Wood et al. | |
| 7,081,665 B2 | 7/2006 | Wood et al. | |
| 7,115,982 B2 | 10/2006 | Moxham | |
| 7,119,001 B2 | 10/2006 | Kang | |
| 7,180,149 B2 | 2/2007 | Yamamoto et al. | |
| 7,215,015 B2 | 5/2007 | Moden | |
| 7,307,348 B2 | 12/2007 | Wood et al. | |
| 7,531,443 B2 | 5/2009 | Pratt | |
| 7,781,868 B2 | 8/2010 | Pratt | |
| 2005/0082654 A1 | 4/2005 | Humpston et al. | |
| 2005/0205951 A1 | 9/2005 | Eskridge | |
| 2006/0017177 A1 | 1/2006 | Seng | |
| 2006/0163679 A1 | 7/2006 | LaFond et al. | |
| 2007/0045780 A1 * | 3/2007 | Akram et al. | 257/621 |
| 2007/0246819 A1 | 10/2007 | Hembree et al. | |
| 2008/0009139 A1 * | 1/2008 | Hecht et al. | 438/705 |
| 2008/0038868 A1 | 2/2008 | Leib | |
| 2009/0152703 A1 | 6/2009 | Pratt | |

OTHER PUBLICATIONS

Notice of Allowance from U.S. Appl. No. 12/388,697, dated Apr. 12, 2010, pp. 1-4.

Office Action from U.S. Appl. No. 11/635,902 (US Patent No. 7,531,443 B2) dated Oct. 9, 2008, pp. 1-12.

PCT International Application No. PCT/US2007/085036, Preliminary Report on Patentability and Written Opinion of the International Searching Authority, Jun. 19, 2009, pp. 1-7.

* cited by examiner

FIG. 4

SYSTEM INCLUDING SEMICONDUCTOR COMPONENTS HAVING THROUGH INTERCONNECTS AND BACK SIDE REDISTRIBUTION CONDUCTORS

CROSS REFERENCE TO RELATED APPLICATION

This application is a division of Ser. No. 12/388,697, filed Feb. 19, 2009, U.S. Pat. No. 7,781,868 B2, which is a division of Ser. No. 11/635,902, filed Dec. 8, 2006, U.S. Pat. No. 7,531,443 B2.

BACKGROUND

In fabricating semiconductor components, it is sometimes necessary to provide interconnects that transmit signals from the circuit side of a semiconductor substrate to the back side of the semiconductor substrate. Interconnects which extend through the semiconductor substrate from the circuit side to the back side are sometimes referred to as "through interconnects". During fabrication of semiconductor substrates at the wafer level through interconnects are sometimes referred to as "through wafer interconnects" (TWI).

Typically through interconnects comprise metal filled vias formed in the semiconductor substrate, that are configured to electrically connect the integrated circuits on the circuit side to electrical elements on the back side of the semiconductor substrate. For example, the back side of the semiconductor substrate can include redistribution conductors and terminal contacts in electrical communication with the through interconnects. The metal in through interconnects typically comprises a highly conductive metal, such as copper or solder, formed as a plug that completely fills a via. In addition, a deposition process, such as screen printing, deposition through a nozzle, or capillary injection can be used to deposit the metal into the via to form the plug.

As semiconductor components become smaller and have higher input/output configurations, semiconductor manufacturers must fabricate through interconnects with increasingly smaller sizes and pitches, but without compromising performance. With regard to performance, through interconnects having a high electrical conductivity and a low parasitic capacitance provide the best performance. Conventional metal filled through interconnects do not have optimal performance characteristics, particularly at elevated temperatures.

In addition to having good performance characteristics, it is advantageous for through interconnects to be capable of fabrication at the wafer level using equipment and techniques that are known in the art. It is also advantageous to incorporate as few steps as possible in the fabrication process in order to minimize cost and defects. Conventional metal filled through interconnects require at least two photopatterning steps, and both front side (circuit side) and back side processing. For example, back side conductors and pads for terminal contacts, which are in electrical communication with the metal filled through interconnects, are made separately, and require additional photo patterning and fabrication steps. The requirement of multiple photo patterning and fabrication steps, and both front side and back side processing, can be very costly.

Another consideration in the fabrication of semiconductor components with through interconnects is the fragility of the integrated circuits contained on the semiconductor substrates. During wafer processing these integrated circuits, as well as other elements contained on the semiconductor substrates, must be protected from damage. Radiation sensitive integrated circuits contained on imaging semiconductor substrates, such as image sensor dice, are particularly vulnerable to damage during fabrication of through interconnects and back side conductors. Further, the semiconductor industry is moving towards chip scale packages that utilize thinned semiconductor substrates. It would be advantageous for a fabrication method for semiconductor components with through interconnects to be capable of handling thinned semiconductor substrates.

The method to be hereinafter described is directed to a wafer level fabrication method for semiconductor components with through interconnects, which addresses the above noted considerations. In addition, improved semiconductor components with through interconnects, and improved systems containing the semiconductor components will be hereinafter described.

BRIEF DESCRIPTION OF THE DRAWINGS

Exemplary embodiments are illustrated in the referenced figures of the drawings. It is intended that the embodiments and the figures disclosed herein are to be considered illustrative rather than limiting.

DETAILED DESCRIPTION

As used herein, "semiconductor component" means an electronic element that includes a semiconductor substrate or makes contact with a semiconductor substrate. "Semiconductor substrate" means an electronic element, such as a semiconductor die, or a semiconductor package that includes integrated circuits and semiconductor devices. A "semiconductor wafer" means a substrate or portion thereof containing a plurality of semiconductor substrates or packages. "Wafer-level" means a process conducted on an element, such as a semiconductor wafer, containing multiple semiconductor components or substrates. "Die level" means a process conducted on a singulated element, such as a singulated semiconductor die or package. "Chip scale" means having an outline about the same as that of a semiconductor substrate. "Wafer size" means having an outline about the same as that of a semiconductor wafer. "Interconnect" means an electrical element which electrically connects electrical elements and transmits signals between these elements. "Through interconnect" means an electrical element which electrically connects electrical elements on different planes or surfaces of a semiconductor substrate and transmits signals between these elements.

Figure 1A:
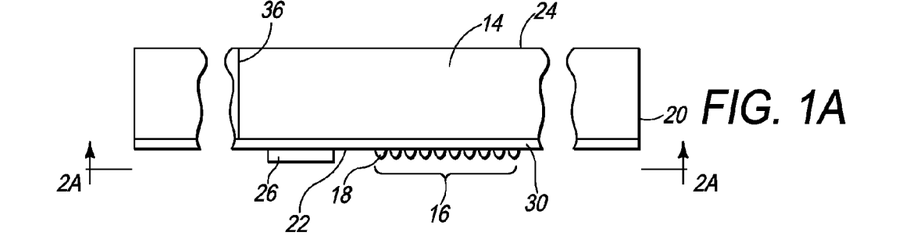
FIGS. 1A-1I are enlarged schematic cross sectional views illustrating steps in a method for fabricating a semiconductor component with through interconnects and back side redistribution conductors.

Referring to FIGS. 1A-1I, 2A-2C and 3A-3C, a method for fabricating semiconductor components 10 (FIG. 3A) with through interconnects 11 (FIG. 3B) and back side redistribution conductors 12 (FIG. 3C) is illustrated. Initially, as shown in FIG. 1A, a semiconductor substrate 14 can be provided. By way of example, the semiconductor substrate 14 (FIG. 1A) can comprise an image sensor die (or an image sensor package) having an imager pixel array 16 (FIG. 1A), and a plurality of integrated circuits 18 (FIG. 1A) in the imager pixel array 16 (FIG. 1A), and on other portions of the semiconductor substrate 14 (FIG. 1A) as well. The integrated circuits 18 (FIG. 1A) can include radiation sensitive integrated circuits in the pixel array 16 (FIG. 1A), such as complimentary metal oxide semiconductor (CMOS) devices. The integrated circuits 18 (FIG. 1A) can also include other types of integrated circuits outside of the imager pixel array 16 (FIG. 1A) for processing image data.

Rather than being an image sensor die (or image sensor package), the semiconductor substrate 14 (FIG. 1A) can comprise another type of semiconductor die, or semiconductor package, having integrated circuits constructed in a desired electrical configuration using active semiconductor devices. For example, the semiconductor substrate 14 (FIG. 1A) can comprise a high speed digital logic device, such as a dynamic random access memory (DRAM), a static random access memory (SRAM), a flash memory, a microprocessor, a digital signal processor (DSP), an application specific integrated circuit (ASIC), a MEMS type device (e.g., accelerometer, microphone, speaker, electro mechanical device), or a solar cell. In addition, the semiconductor substrate 14 can comprise a tested die that has been certified as a known good die (KGD).

Figure 2A:
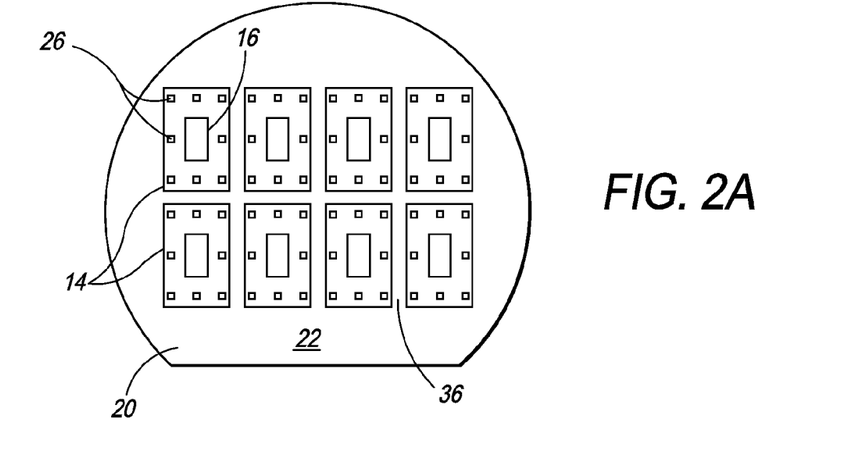
FIG. 2A is an enlarged schematic bottom view taken along line 2A-2A of FIG. 1A.

As shown in FIG. 2A, the semiconductor substrate 14 is initially contained on a semiconductor wafer 20, which includes a plurality of substantially identical semiconductor substrates 14. However, although a semiconductor wafer 20 is illustrated, it is to be understood that the method can be performed on any substrate which contains one or more semiconductor substrates 14. For example, rather than the semiconductor wafer 20 (FIG. 2A), a substrate can comprise a portion of a semiconductor wafer, a panel, a leadframe or a circuit board containing multiple semiconductor substrates. In the claims to follow, the term "substrate" is used to encompass all of these elements. The semiconductor substrate 14 (FIG. 2A), and the semiconductor wafer 20 (FIG. 2A) as well, can have any desired thickness. As such, the semiconductor wafer 20 (FIG. 2A) can comprise a "full thickness" wafer, or a "thinned" wafer.

As shown in FIG. 1A, the semiconductor substrate 14, and the semiconductor wafer 20 as well, include a circuit side 22 (front side), wherein the imager pixel array 16 and the integrated circuits 18 are located, and a back side 24. The circuit side 22 and the back side 24 of the semiconductor substrate 14 are major planar surfaces, which are generally parallel to one another, and separated by a thickness of the semiconductor substrate 14. As shown in FIG. 2A, each semiconductor substrate 14 has a generally square, die sized, peripheral outline. However, the semiconductor substrates 14 can have any polygonal peripheral outline used in the art. For illustrative purposes in FIGS. 1A-1I, a partial semiconductor substrate 14 is shown. In addition, the streets or scribe area 36 (FIG. 2A) between adjacent semiconductor substrates 14 are denoted by spaces on the wafer 20 in FIG. 2A, and by a vertical line in FIG. 1A.

As also shown in FIG. 1A, the semiconductor substrate 14 includes a plurality of substrate contacts 26 on the circuit side 22 in electrical communication with the integrated circuits 18 on the semiconductor substrate 14. The substrate contacts 26 can comprise device bond pads, or alternately redistribution contacts (i.e., contacts formed in conjunction with a redistribution layer (RDL)). In addition, the substrate contacts 26 can comprise a highly-conductive, bondable metal, such as aluminum or copper. The substrate contacts 26 can also comprise stacks of different metals, such as aluminum-nickel-gold, aluminum-nickel-solder, copper-palladium, and aluminum-copper.

For simplicity, each semiconductor substrate 14 (FIG. 2A) is illustrated with only eight substrate contacts 26 (FIGS. 1A and 2A) arranged in an edge array along the peripheral edges of the semiconductor substrates 14. However, in actual practice the semiconductor substrates 14 (FIGS. 1A and 2A) can include tens to hundreds of substrate contacts 26 (FIGS. 1A and 2A) arranged in a desired configuration, such as a center array, an edge array or an area array. Also in the illustrative embodiment, the substrate contacts 26 (FIGS. 1A and 2A) have a generally square peripheral outline. However, as with the semiconductor substrates 14 (FIG. 2A), the substrate contacts 26 (FIGS. 1A and 2A) can have any polygonal shape including square, rectangular, circular, triangular and oval. In addition, a size of the substrate contacts 26 (FIGS. 1A and 2A) can be selected as required. For example, each substrate contact 26 (FIGS. 1A and 2A) can have a width on each side of from about 5 μm to 200 μm. Further, each substrate contact 26 (FIGS. 1A and 2A) can comprise a generally planar pad as shown, or can have other shapes such as a projection, a bump or a volcano shape.

As also shown in FIG. 1A, the semiconductor substrate 14 includes an electrical insulation layer 30 formed on the circuit side 22 thereof. The electrical insulation layer 30 is configured to electrically insulate the integrated circuits 18, other integrated circuits outside of the pixel array 16, and other electrical elements as well, from the remainder of the semiconductor substrate 14. The electrical insulation layer 30 can comprise a die passivation layer, or a redistribution insulation layer, formed of a material such as BPSG, $SiO_2$, or polyimide. For illustrative purposes, the substrate contacts 26 are illustrated as being on the electrical insulation layer 30. However, internal conductors (not shown) provide electrical paths between the substrate contacts 26 and the integrated circuits 18, between the substrate contacts 26 and other integrated circuits outside of the pixel array 16, and between the substrate contacts 26 and other electrical elements as well. All of the elements of the semiconductor substrate 14 (FIG. 1A) including the integrated circuits 18 (FIG. 1A), the pixel array 16 (FIG. 1A), the substrate contacts 26, and the insulation layer 30 (FIG. 1A), can be formed using well known semiconductor fabrication processes.

Figure 1B:
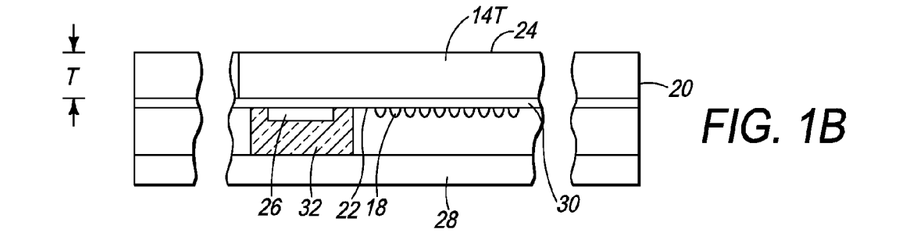

Next, as shown in FIG. 1B, spacers 32 and a wafer scale carrier 28 can be attached to the circuit side 22 of the semiconductor wafer 20. For some applications, such as processing of a full thickness wafer, the carrier 28 can be eliminated from the method. The spacers 32 (FIG. 1B) can have a selected size and geometry, and can comprise an electrically insulating material, such as a polymer material, a glass material or a ceramic material attached to the substrate contacts 26 (FIG. 1B). Alternately, the spacers 32 (FIG. 1B) can be eliminated, and adhesive layers (not shown) can be utilized to attach the carrier 28 (FIG. 1B) to the wafer 20 (FIG. 1B). The carrier 28 (FIG. 1B) can comprise a glass or silicon material having a selected thickness, and a selected peripheral outline.

In addition, the carrier 28 (FIG. 1B) can comprise a separate member configured for attachment to the wafer 20 (FIG. 1B) to support and protect the wafer 20 (FIG. 1B) and the integrated circuits 18 (FIG. 1B) during processing. Because the steps of the method are performed primarily from the back side 24 (FIG. 1B) of the wafer 20 (FIG. 1B), the circuit side 22 (FIG. 1B) can remain face down and protected by the carrier 28 (FIG. 1B). Still further, following further processing to be hereinafter described, the carrier 28 (FIG. 1B) can be configured to provide die sized transparent covers 28S (FIG. 3B) in the completed semiconductor components 10 (FIG. 3B). In addition, the transparent covers 28S (FIG. 3B) can be further processed as lenses, or separate lens structures can be attached to the covers 28S (FIG. 3B).

Rather than being configured to form transparent covers 28S (FIG. 3B), the carrier 28 (FIG. 1B) can comprise a temporary carrier that is removed following the fabrication process. In this case, separate transparent covers or lenses can be attached to the component 10 (FIG. 3B) at the end of the fabrication method. For example, temporary carriers made of glass, or temporary carrier in the form of blank silicon wafers, can be fused by heat and adhesives to the wafer 20 (FIG. 1B) to protect the circuit sides 22 of the semiconductor substrates 14 during back side processes, such as etching, grinding and chemical mechanical planarization (CMP). Suitable temporary carriers are manufactured by 3-M Corporation of St. Paul, Minn., and others as well. Silicon wafers, which can also be utilized to form a temporary carrier, are also available from a variety of manufacturers.

As also shown in FIG. 1B, the back side 24 of the semiconductor wafer 20 can be thinned to form thinned semiconductor substrates 14T. The thinning step can be performed by mechanically planarizing the wafer 20 (FIG. 1B), or by etching the wafer 20 (FIG. 1B). For example, the thinning step can be performed using a mechanical planarization apparatus (e.g., a grinder). One suitable mechanical planarization apparatus is manufactured by Okamoto, and is designated a model no. VG502. The thinning step can also be performed using a chemical mechanical planarization (CMP) apparatus. A suitable CMP apparatus is commercially available from a manufacturer such as Westech, SEZ, Plasma Polishing Systems, or TRUSI. The thinning step can also be performed using an etch back process, such as a wet etch process, a dry etch process or a plasma etching process. The thinned semiconductor substrates 14T (FIG. 1B) can have a selected thickness T (FIG. 1B) of from about 10 μm to 700 μm.

Figure 1C:
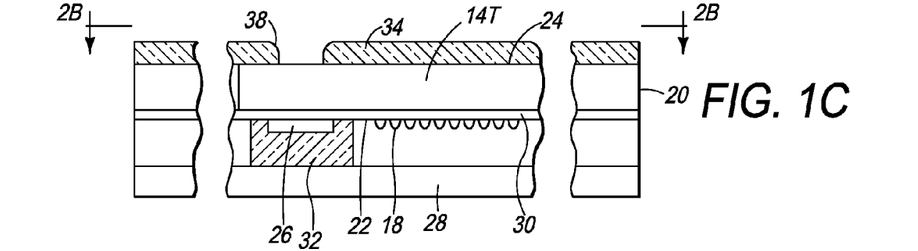
Figure 2B:
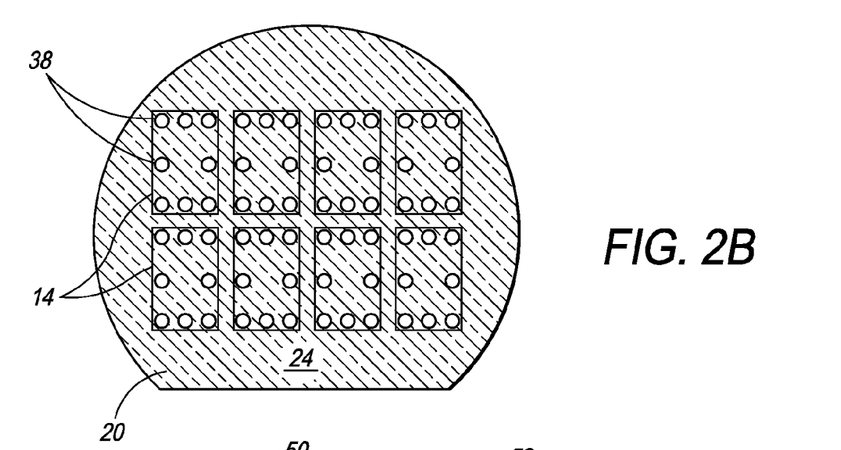
FIG. 2B is an enlarged schematic plan view taken along line 2B-2B of FIG. 1C.

Next, as shown in FIG. 1C, a back side insulation layer 34 can be formed on the semiconductor wafer 20, and on the back sides 24 of the thinned semiconductor substrates 14T. The back side insulation layer 34 (FIG. 1C) can comprise a low dielectric constant (low k) polymer such as polyimide, polybenzoxazole (PBO), or benzocyclobutene (BCB). The back side insulation layer 34 (FIG. 1C) can also comprise a low temperature oxide or nitride layer. As also shown in FIG. 1C, the back side insulation layer 34 (FIG. 1C) can be patterned with openings 38 (FIG. 1C) that align with the substrate contacts 26 (FIG. 1C) on the circuit sides 22 (FIG. 1C) of the thinned semiconductor substrates 14T (FIG. 1C). By way of example, the back side insulation layer 34 (FIG. 1C) can be initially blanket deposited to a desired thickness using a suitable deposition process such as spin on, positive displacement through a nozzle, screen printing or stenciling. The back side insulation layer 34 (FIG. 1C) can then be patterned and cured using a suitable process, such as wet chemical etching through a photo mask. Alternately, the back side insulation layer 34 (FIG. 1C) can comprise a photoimageable material, such as a resist or a photoimageable polyimide, that can be patterned directly without a photo mask. A size (e.g., diameter) of the openings 38 (FIG. 1C) can be selected as required. For example, the openings 38 (FIG. 1C) can be slightly smaller than the size of the substrate contacts 26 (FIG. 1C). A shape of the openings 38 (FIG. 1C) can also be selected as required. As shown in FIG. 2B, the openings 38 can have a circular shape, or alternately any polygonal shape. Patterning of the back side insulation layer 34 (FIG. 1C) to form the openings 38 (FIG. 1C) is termed herein as photo alignment step 1.

Figure 1D:
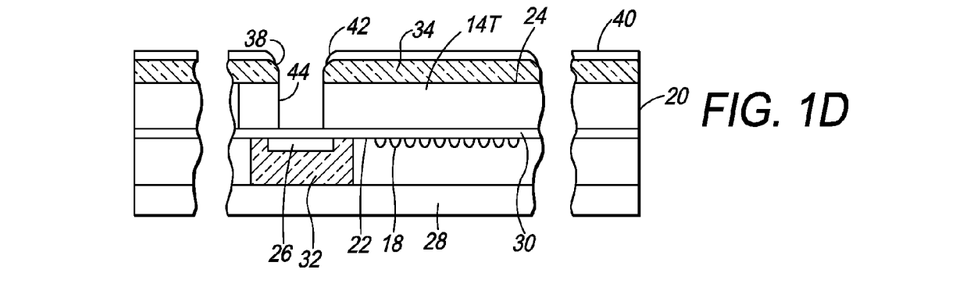

Next, as shown in FIG. 1D, a via forming step can be performed in which vias 44 (FIG. 1D) are formed from the back sides 24 of the thinned semiconductor substrates 14T (FIG. 1D) in alignment with the substrate contacts 26. Following the via forming step illustrated in FIG. 1D, the vias 44 are generally perpendicular (orthogonal) to the back sides 24 of the thinned semiconductor substrates 14T (FIG. 1D). The vias 44 (FIG. 1D) can be formed using a dry or wet etch process that is endpointed at the insulation layer 30 (FIG. 1D). For example, the vias 44 (FIG. 1D) can be formed using a dry etch process, such as a BOSCH etch. Alternately, the vias 44 (FIG. 1D) can be formed using a wet etchant and a wet etching process. For example, an anisotropic wet etch process can be performed using a solution of KOH and $H_2O$, and an isotropic etch process can be performed using a solution of HF, $HNO_3$ and $H_2O$. The size of the vias 44 (FIG. 1D) can correspond to the size of the substrate contacts 26 (FIG. 1D). In FIG. 1D, the vias 44 are illustrated as being slightly smaller than the substrate contacts 26. By way of example, the diameter of each via 44 (FIG. 1D) can be from 10 μm to 2 mils or greater.

Preferably, the vias 44 (FIG. 1D) are formed by etching directly through the openings 38 (FIG. 1D) in the insulation layer 34 (FIG. 1D). With the insulation layer 34 (FIG. 1D) used as an etch mask, a photo alignment step is not required for forming the vias 44 (FIG. 1D). In this case, the insulation layer 34 (FIG. 1D) can be made thick enough to accommodate material loss during etching, or can comprise an etch resistant material.

As also shown in FIG. 1D, as an alternative to etching through the openings 38 (FIG. 1D) in the insulation layer 34 (FIG. 1D), the vias 44 (FIG. 1D) can be etched using an etch mask 40 (FIG. 1D). For example, the etch mask 40 (FIG. 1D) can formed on the insulation layer 34 (FIG. 1D), and patterned with openings 42 (FIG. 1D) that align with the openings 38 (FIG. 1D) in the insulation layer 34 (FIG. 1D). In this case, the etch mask 40 (FIG. 1D) can comprise a resist that is photo patterned with the openings 38 (FIG. 1D). Patterning of the etch mask 40 (FIG. 1D) requires a photo alignment step which is termed herein as photo alignment step 2.

Figure 1E:
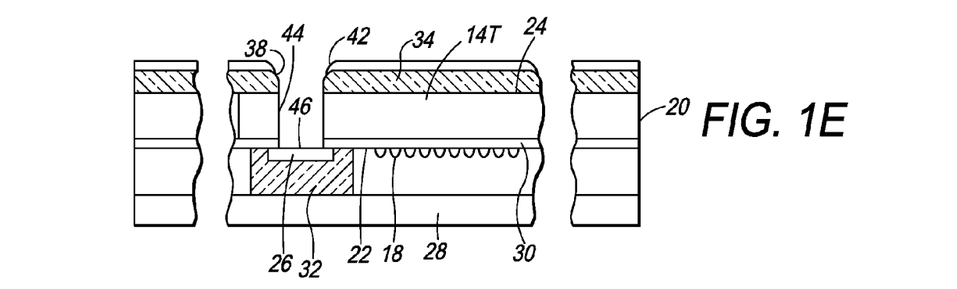

Next, as shown in FIG. 1E, the insulation layer 30 (FIG. 1E) in the vias 44 (FIG. 1E) can be removed to expose the inner surfaces 46 (FIG. 1E) of the substrate contacts 26 (FIG. 1E). The insulation layer 30 (FIG. 1E) in the vias 44 (FIG. 1E) can be removed using an etching process such as oxide dry etching.

Figure 1F:
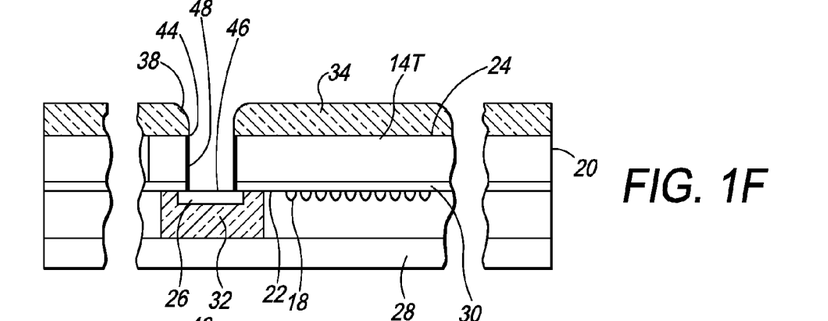

Next, as shown in FIG. 1F, the vias 44 (FIG. 1F) are lined with via insulation layers 48 (FIG. 1F) that will electrically insulate the through interconnects 11 (FIG. 3B) from the remainder of the thinned semiconductor substrates 14T (FIG. 1F). The via insulation layers 48 (FIG. 1F) preferably have a thickness of only a few microns or less, such that the vias 44 (FIG. 1F) remain open. The via insulation layers 48 (FIG. 1F) can comprise an electrically insulating polymer material, such as polyimide, that can be deposited into the vias 44 using a suitable process such as screen printing, deposition through a nozzle, or capillary injection. The via insulation layers 48 (FIG. 1F) can also comprise a polymer such as parylene, that can be vapor deposited into the vias 44 (FIG. 1F), or an oxide, such as $SiO_2$ that can be either grown in place, or deposited using a suitable deposition process. Following the deposition process, excess insulating material can be removed using a spacer etch, such that the vias 44 are lined, and the inner surfaces 46 (FIG. 1F) of the substrate contacts 26 (FIG. 1F) are exposed.

Figure 1G:
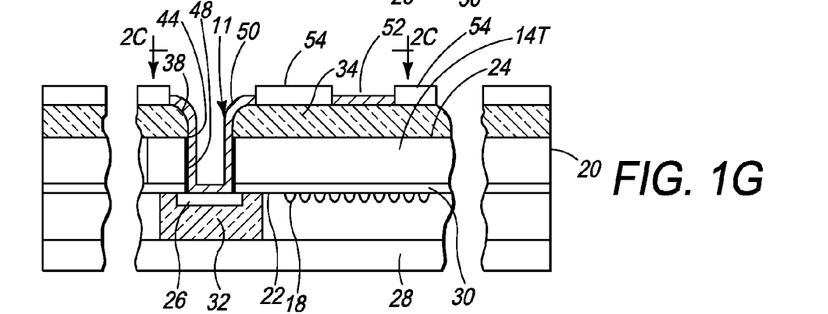
Figure 1I:
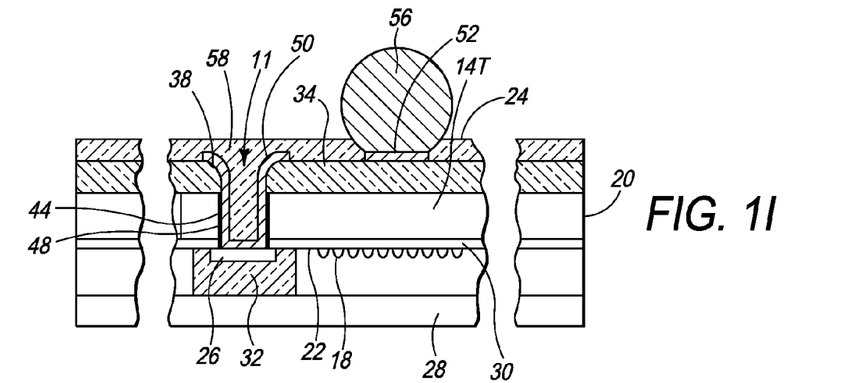
Figure 2C:
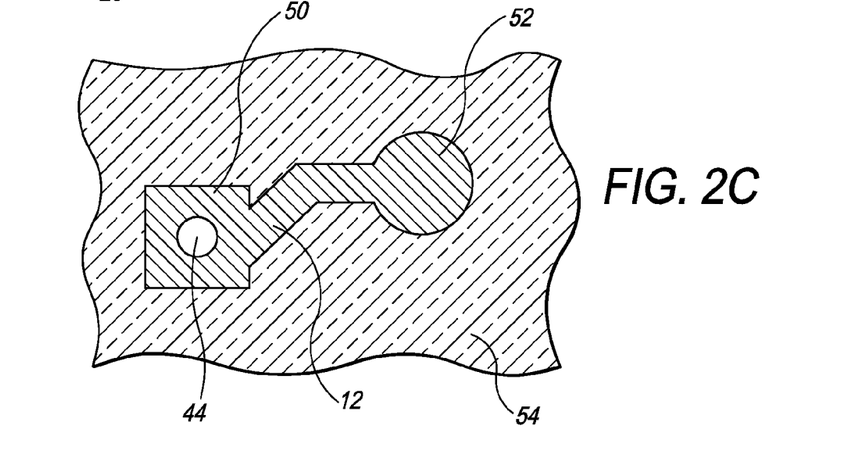
FIG. 2C is an enlarged schematic plan view taken along line 2C-2C of FIG. 1G.

Next, as shown in FIG. 1G, a conductive layer 50 (FIG. 1G) is formed in the vias 44 (FIG. 1G) in physical and electrical contact with the substrate contacts 26 (FIG. 1G), and on the back side 24 of the thinned semiconductor substrate 14T. The conductive layer 50 (FIG. 1G) forms the through interconnects 11 (FIG. 1I), the redistribution conductors 12 (FIG. 2C), and the terminal contact pads 52 (FIG. 2C) for the terminal contacts 56 (FIG. 1I). As such, the through interconnects 11 (FIG. 1I), the redistribution conductors 12 (FIG. 2C) and the terminal contact pads 52 (FIG. 2C) comprise a same metal layer (i.e., the conductive layer 50) are formed using a same metal deposition step. For forming the through interconnects 11 (FIG. 1I), the conductive layer 50 (FIG. 1G) at least partially lines the sidewalls of the vias 44 (FIG. 1G), and at least partially lines the inner surfaces 46 (FIG. 1F) of the substrate contacts 26 (FIG. 1G). As with the via insulation layers 48 (FIG. 1G), the conductive layer 50 (FIG. 1G) is formed such that the vias 44 (FIG. 1G) remain open. As such, the conductive layer 50 (FIG. 1G) can have a thickness of only a few microns or less. In addition, as shown in FIG. 2C, the conductive layer 50 (FIG. 2C) is patterned to cover selected areas on the surface of the insulation layer 34 (FIG. 1G) circumjacent to the vias 44 (FIG. 2C).

One method for forming the conductive layer 50 (FIG. 1G) comprises electroless deposition. One advantage of electroless deposition is that the redistribution conductors 12 (FIG. 2C), and the terminal contact pads 52 (FIG. 2C) as well, can be formed at the same time out of the same metal layer. This eliminates at least one photo alignment step relative to prior art methods for forming metal through interconnects, wherein separate photo patterning steps are used to form the through interconnects and the redistribution conductors. Another advantage of the outlined method is that the process steps can be performed from the back side 24 (FIG. 2B) of the wafer 20 (FIG. 2B) with the circuit side 22 (FIG. 2A) of the wafer 20 protected by the carrier 28 (FIG. 1B).

As shown in FIG. 1G, for forming the conductive layer 50 (FIG. 1G), by electroless deposition, a deposition mask 54 (FIG. 1G) can be formed on the surface of the insulation layer 34 (FIG. 1G). The deposition mask 54 (FIG. 1G) includes openings ("second openings" in the claims) that align with the vias 44 (FIG. 1G), and other elongated openings ("third openings" in the claims), which determine the pattern of the redistribution conductors 12 (FIG. 2C), and the terminal contact pads 52 (FIG. 2C). However, prior to forming the deposition mask 54 (FIG. 1G), a copper seed layer can be formed in the vias 44 (FIG. 1G), and on the surface of the insulation layer 34 (FIG. 1G).

Following formation of the copper seed layer, a resist layer can be formed on the copper seed layer, and photopatterned to define the deposition mask 54 (FIG. 1G). This patterning step is termed herein as photo alignment step 3. Next, the wafer 20 (FIG. 2A) can be dipped in an electroless or an electrolytic copper plating solution, such that copper is applied to areas of the seed layer not covered by the deposition mask 54 (FIG. 1G). The copper can be electrolessly plated to form the conductive layer 50 (FIG. 1G) with a thickness of from about 1 μm to 10 μm. In addition, the electrolessly plated copper can be plated with another metal such as nickel, using another plating solution, such that the conductive layer 50 (FIG. 1G) comprises a bi-metal stack of Cu/Ni.

Figure 1H:
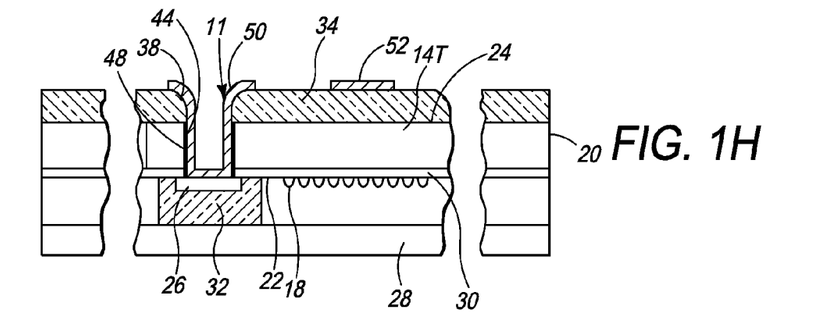

Next, as shown in FIG. 1H, following electroless copper plating, and nickel plating, the deposition mask 54 (FIG. 1G) can be stripped using plasma etching or other suitable process. In addition, the exposed copper seed layer can be removed by etching, such that just the conductive layer 50 (FIG. 1G) remains in the pattern which forms the through interconnects 11 (FIG. 1H), and defines the redistribution conductors 12 (FIG. 2C) and the terminal contact pads 52 (FIG. 1H). During the seed layer removal process, the nickel layer provides an etch mask for protecting the conductive layer 50. The outlined process for forming the conductive layer 50 (FIG. 1H) by electroless plating is merely exemplary, and other processes known in the art can be employed to form the conductive layer 50 (FIG. 1H) using other metals, such as Al, Cr, Ti, Ni, W, Au, Ag, Ta, Mb. Other suitable deposition processes include CVD, PECVD, PVD, sputtering and evaporation.

Next, as shown in FIG. 1I, an outer insulation layer 58 (FIG. 1I) can be formed on the insulation layer 34 (FIG. 1I) and in the vias 44 (FIG. 1I). The outer insulation layer 58 (FIG. 1I) covers the conductive layer 50 (FIG. 1G) in the vias 44 (FIG. 1I) and the redistribution conductors 12 (FIG. 2C). However, the outer insulation layer 58 (FIG. 1I) can be patterned with openings such that the terminal contact pads 52 (FIG. 1I) remain exposed. The outer insulation layer 58 (FIG. 1I) can comprise a low dielectric constant (low k) polymer such as polyimide, polybenzoxazole (PBO), or benzocyclobutene (BCB). By way of example, the outer insulation layer 58 (FIG. 1I) can be initially blanket deposited to a desired thickness using a suitable deposition process such as spin on, positive displacement through a nozzle, screen printing or stenciling. The outer insulation layer 58 (FIG. 1I) can then be patterned and cured using a suitable process, such as wet chemical etching through a photo mask. Alternately, the outer insulation layer 58 (FIG. 1I) can comprise a photoimageable material, such as a resist or a photoimageable polyimide, that can be patterned directly without a photo mask.

As also shown in FIG. 1I, the terminal contacts 56 (FIG. 1I), or outer lead bonds (OLB), can be formed on the terminal contact pads 52 (FIG. 1I). In addition, the terminal contacts 56 (FIG. 1I) are in electrical communication with the through interconnects 11 (FIG. 1I), which form the inner lead bonds (ILB). However, prior to forming the terminal contacts 56 (FIG. 1I), under bump metallization layers can be formed on the terminal contact pads 52 (FIG. 1I). The terminal contacts 56 (FIG. 1I) can comprise metal, or solder, balls, bumps or pins, formed on the terminal contact pads using a metallization process, a stud bumping process or a ball bonding process. A representative range for the diameter of the terminal contacts 56 (FIG. 1I) can be from 60-500 μm. In addition, the terminal contact pads 52 (FIG. 1I) and the terminal contacts 56 (FIG. 1I), can be formed in an area array, such as a ball grid array, a pin grid array, an edge array or a center array.

Following formation of the terminal contacts 56 (FIG. 1I), a singulating step can be performed to singulate the thinned semiconductor substrates 14T (FIG. 1I) from the semiconductor wafer 20 (FIG. 2A). The singulating step can be performed using a dicing saw configured to dice semiconductor wafers into individual dice. Alternately, rather than by sawing, the singulating step can be performed using another singulation method, such as cutting with a laser or a water jet, or by etching with a suitable wet or dry etchant. Prior to the singulating step, the temporary carrier 28 (FIG. 1I), if used, can be detached from the wafer 20 (FIG. 2A). Alternately, the temporary carrier 28 (FIG. 1I) can be configured to form the transparent covers 28S (FIG. 3B), in which case it can be singulated with the wafer 20 (FIG. 2A) to form the transparent covers 28S (FIG. 3B).

Figure 3A:
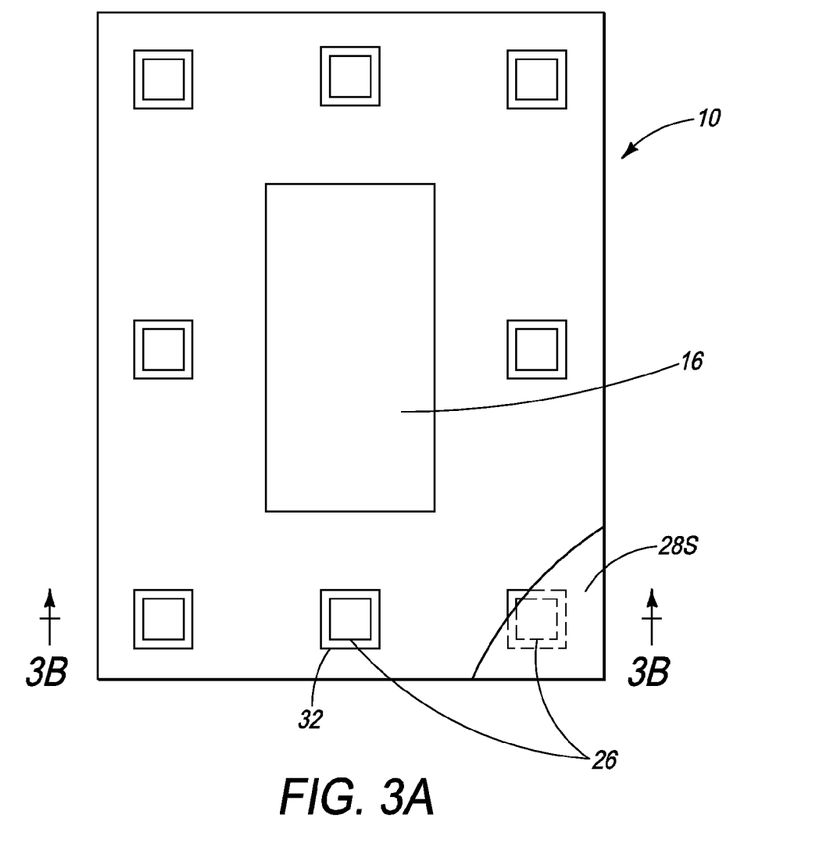
FIG. 3A is an enlarged schematic plan view, partially cut away, of the semiconductor component.
Figure 3B:
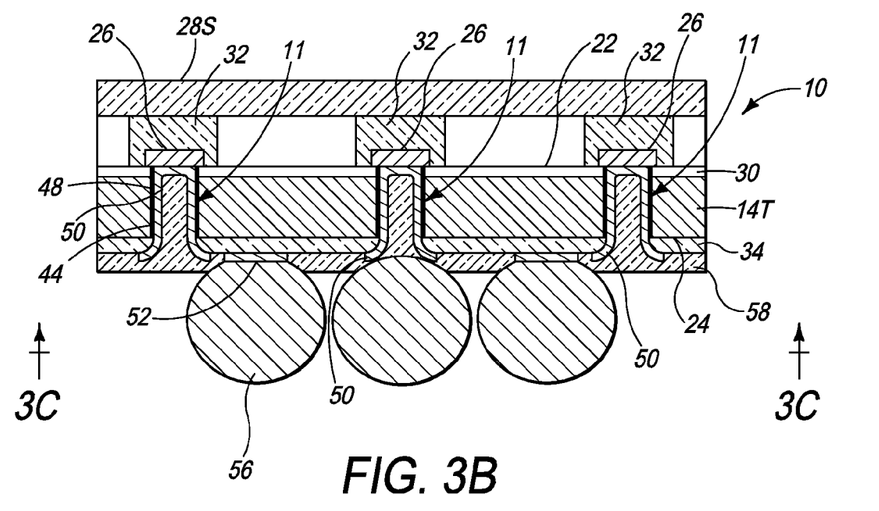
FIG. 3B is an enlarged schematic cross sectional view of the semiconductor component taken along section line 3B-3B of FIG. 3A.

Referring to FIGS. 3A-3C, the semiconductor component 10 is shown. The semiconductor component 10 includes the thinned semiconductor substrate 14T (FIG. 3B) having the pixel array 16 (FIG. 3A) and the integrated circuits 18 (FIG. 1A). The semiconductor component 10 also includes the transparent cover 28S (FIG. 3B) and the spacers 32 (FIG. 3B), which attach and space the transparent cover 28S (FIG. 3B) on the thinned semiconductor substrate 14T (FIG. 3B). For simplicity, the transparent cover 28S (FIG. 3B) is illustrated as being formed from the temporary carrier 28 (FIG. 1I). However, it is to be understood that the transparent cover 28S (FIG. 3B) can comprise a separately attached element. In addition, the semiconductor component 10 can also include one or more lenses (not shown) either in place of or attached to the transparent cover 28S (FIG. 3B).

The semiconductor component 10 also includes the through interconnects 11 (FIG. 3B) in the thinned semiconductor substrate 14T (FIG. 3B), which electrically connect the substrate contacts 26 (FIG. 3B) to the terminal contacts 56 (FIG. 3B). Each through interconnect 11 (FIG. 3B) includes an insulated via 44 (FIG. 3B), and a portion of the conductive layer 50 (FIG. 3B) lining the sidewalls of the via 44 (FIG. 3B) and the inner surface 46 (FIG. 1F) of an associated substrate contact 26 (FIG. 3B). Each through interconnect 11 (FIG. 3B) also includes portions of the outer insulation layer 58 (FIG. 3B) in the via 44 (FIG. 3B). The outer insulation layer 58 (FIG. 3B) thus serves the dual purpose of insulating the back side of the component 10, and the through interconnects 11 (FIG. 3B) as well.

Figure 3C:
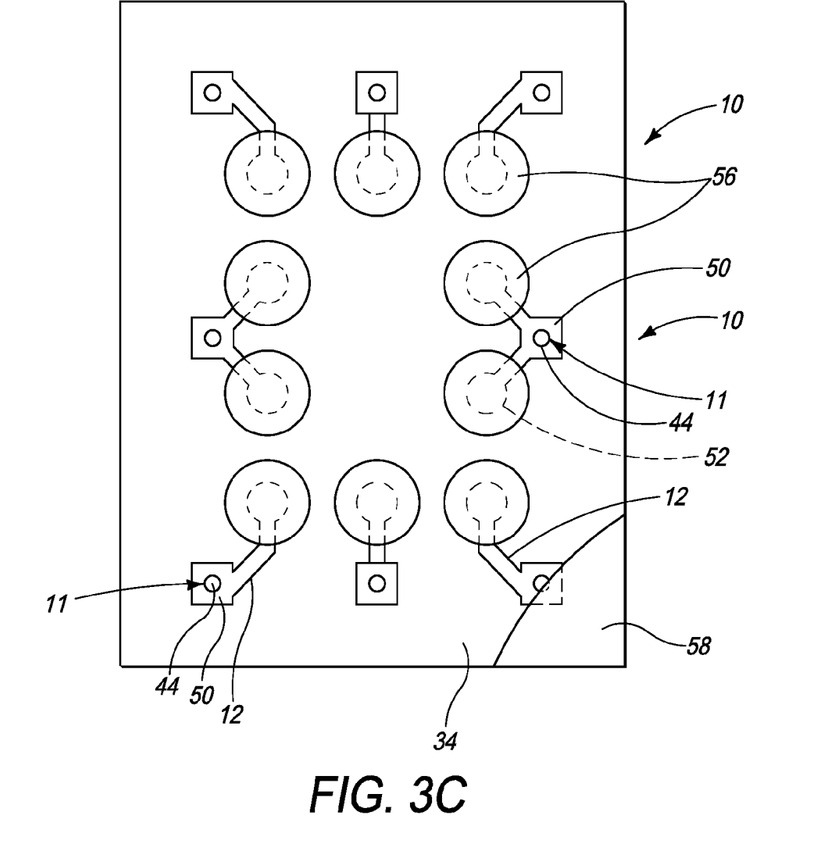
FIG. 3C is an enlarged schematic bottom view, partially cut away, of the semiconductor component taken along line 3C-3C of FIG. 3B.

As shown in FIG. 3C, the semiconductor component 10 also includes the redistribution conductors 12 (FIG. 3C), the terminal contact pads 52 (FIG. 3C), and the terminal contacts 56 (FIG. 3C), in electrical communication with the through interconnects 11 (FIG. 3B). The redistribution conductors 12 (FIG. 3C) are formed from the conductive layer 50 (FIG. 3B), which also forms the through interconnects 11 (FIG. 3B). In addition, the redistribution conductors 12 (FIG. 3C) redistribute the pattern of the substrate contacts 26 (FIG. 3B) to the pattern of the terminal contact pads 52 (FIG. 3C), and the terminal contacts 56 (FIG. 3C). In the claims the pattern of the substrate contacts 26 (FIG. 3B) is termed the "first pattern", and the pattern of the terminal contact pads 52 (FIG. 3C) and the terminal contacts 56 (FIG. 3C) is termed the "second pattern".

Figure 4:
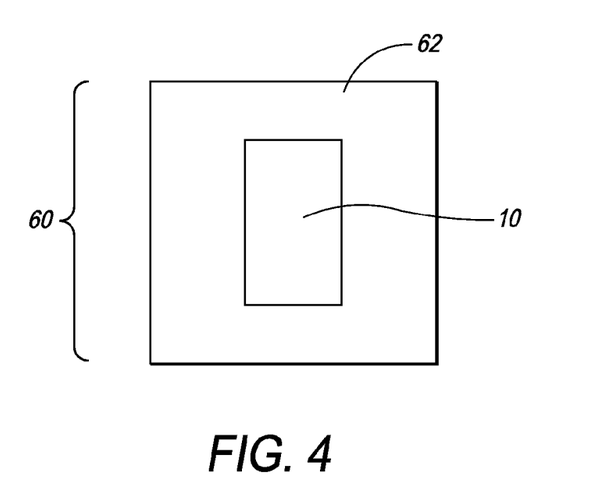
FIG. 4 is a schematic diagram of a system incorporating the semiconductor component.

The semiconductor component 10 (FIGS. 3A-3C) can be used as a stand alone device, and in combination with other semiconductor components to fabricate semiconductor systems for consumer products (e.g., cell phones, camcorders) and computers. As shown in FIG. 4, a semiconductor system 60 (FIG. 4) can include a supporting substrate 62 (FIG. 4), such as a module substrate, a printed circuit board, or a computer mother board wherein the semiconductor component 10 is mounted.

While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

What is claimed is:
1. A system comprising:
    a supporting substrate;
    at least one semiconductor substrate on the supporting substrate comprising a plurality of integrated circuits including a plurality of radiation sensitive integrated circuits, a plurality of substrate contacts in electrical communication with the integrated circuits, and a plurality of through interconnects and redistribution conductors;
    each through interconnect comprising a via aligned with a substrate contact and a conductive layer at least partially lining the via in physical and electrical contact with the substrate contact,
    each redistribution conductor comprising a portion of the conductive layer, and
    a transparent cover attached to the semiconductor substrate configured to protect the radiation sensitive integrated circuits.
2. The system of claim 1 wherein the redistribution conductors include terminal contact pads in an area array, and further comprising a plurality of terminal contacts on the terminal contact pads.
3. The system of claim 1 wherein the semiconductor substrate comprises an imager die.
4. The system of claim 1 wherein the semiconductor substrate comprises a high speed digital logic device selected from the group consisting of a dynamic random access memory (DRAM), a static random access memory (SRAM), a flash memory, a microprocessor, a digital signal processor (DSP), an application specific integrated circuit (ASIC), a MEMS type device, and a solar cell.
5. The system of claim 1 wherein the transparent cover comprises a lens.
6. The system of claim 1 wherein the supporting substrate comprises a module substrate, a circuit board or a computer mother board.
7. A system comprising:
    a supporting substrate; and
    a component on the supporting substrate comprising a circuit side, a back side, a plurality of substrate contacts on the circuit side, a plurality of through interconnects in electrical contact with the substrate contacts comprising electrically insulated vias extending from the substrate contacts to the back side, a plurality of back side conductors on the back side in electrical communication with the through interconnects, and a plurality of terminal contacts in electrical communication with the conductors flip chip mounted to the supporting substrate;
    the through interconnects and the back side conductors comprising a same conductive layer lining the vias in physical and electrical contact with the substrate contacts and extending over the back side.
8. The system of claim 7 wherein the terminal contacts comprise the same conductive layer.
9. The system of claim 7 wherein the component comprises an imager semiconductor die and the substrate includes a lens covering the die.
10. The system of claim 7 wherein the supporting substrate comprises a module substrate, a circuit board or a computer mother board.
11. The system of claim 7 wherein the component comprises a semiconductor die comprising a plurality of integrated circuits in electrical communication with the substrate contacts, and the conductive layer at least partially lines the substrate contacts.

* * * * *

UNITED STATES PATENT AND TRADEMARK OFFICE
CERTIFICATE OF CORRECTION

| | | |
|---|---|---|
| PATENT NO. | : 7,952,170 B2 | Page 1 of 1 |
| APPLICATION NO. | : 12/837551 | |
| DATED | : May 31, 2011 | |
| INVENTOR(S) | : David S. Pratt | |

It is certified that error appears in the above-identified patent and that said Letters Patent is hereby corrected as shown below:

In column 10, line 16, in Claim 1, delete "layer," and insert -- layer; --, therefor.

Signed and Sealed this
Nineteenth Day of July, 2011

David J. Kappos
*Director of the United States Patent and Trademark Office*